(12) United States Patent
Takahashi et al.

(10) Patent No.: US 6,607,981 B1
(45) Date of Patent: Aug. 19, 2003

(54) METHOD FOR FORMING A CU INTERCONNECT PATTERN

(75) Inventors: Hisaya Takahashi, Toyama (JP); Hirofumi Nakamura, Toyama (JP); Masanobu Izaki, Nara (JP); Junichi Katayama, Osaka (JP)

(73) Assignees: NEC Corporation, Tokyo (JP); Osaka Municipal Government, Osaka (JP)

( * ) Notice: Subject to any disclaimer, the term of this patent is extended or adjusted under 35 U.S.C. 154(b) by 211 days.

(21) Appl. No.: 09/656,657

(22) Filed: Sep. 7, 2000

(30) Foreign Application Priority Data

Sep. 13, 1999 (JP) .......................................... 11-258477

(51) Int. Cl.⁷ .............................................. H01L 21/44
(52) U.S. Cl. ...................... 438/678; 438/674; 438/675; 438/687
(58) Field of Search ................... 438/674, 675, 438/677, 678, 687

(56) References Cited

U.S. PATENT DOCUMENTS 5,424,252 A * 6/1995 Morishita .................. 438/678

FOREIGN PATENT DOCUMENTS

| JP | 7-321111 | 12/1995 | ....... H01L/21/3205 |
| JP | 9-260808 | 10/1997 | ........... H06K/3/18 |
| JP | 10-43589 | 2/1998 | ........... B01J/23/60 |
| JP | 10-245682 | 9/1998 | ........... C23C/18/14 |

OTHER PUBLICATIONS

"Electroless Copper Plating Using ZnO Thin Film Coated on a Glass Substrate", J. Electrochem. Soc., vol. 141, No. 5, May 1994.

* cited by examiner

Primary Examiner—Amir Zarabian
Assistant Examiner—Christy Novacek
(74) Attorney, Agent, or Firm—Michael Best & Friedrich, LLC

(57) ABSTRACT

A method for forming a Cu interconnect pattern on a ZnO film of a printed circuit board without using a metallic catalyst on the ZnO film includes the steps of replacing Zn in the ZnO film by Cu in an aqueous solution of copper sulfate to form a CuO film, reducing the CuO in the CuO film to Cu in an aqueous solution of hydrogenated boron potassium to form a metallic Cu film, and plating the metallic Cu film with a plating Cu film in a plating liquid. The absence of the metallic catalyst improves the insulation resistance of the Cu interconnect pattern in the printed circuit board.

11 Claims, 4 Drawing Sheets

METHOD FOR FORMING A CU INTERCONNECT PATTERN

BACKGROUND OF THE INVENTION (a) Field of the Invention

The present invention relates to a method for forming a Cu interconnect pattern and, more particularly, to a technique for forming a Cu interconnect pattern having a higher reliability and a higher density on a zinc oxide film in a printed circuit board, semiconductor device, LCD panel etc.

(b) Description of the Related Art

The conventional techniques for forming a Cu interconnect pattern on a zinc oxide film overlying a substrate of a printed circuit board, such as ceramic substrate, glass substrate, silicon wafer substrate and organic resin substrate, include subtractive process, semi additive process, and additive process.

Each of the processes as mentioned above includes the steps of forming a zinc oxide (ZnO) film overlying a substrate, forming a metallic catalyst film including tetravalent tin ions and divalent palladium ions on the ZnO film to activate the ZnO film by the metallic catalyst film.

The subtractive process is reported by H. Yoshiki, K. Hashimoto, and A. Fujisima in "Electroless Copper Plating Using ZnO Thin Film Coated on a Glass Substrate", J. Electrochem. Soc., Vol. 141, No.5, May 1994.

The subtractive process includes, in addition to the steps as mentioned above, the steps of plating the ZnO film with a Cu interconnect film by using an electroless plating (chemical plating) technique or a combination of consecutive electroless plating and electrolytic plating (panel plating) techniques, forming a temporary plating resist film on the Cu interconnect film by a coating or bonding process, patterning the resist film to leave a portion of the resist film as a masking film, and wet-etching a portion of the Cu interconnect film not covered by the masking film while using a suitable etchant, to form a Cu interconnect pattern.

The semi additive process includes, in addition to the steps as mentioned above, the steps of plating the ZnO film with a thin metallic seed film by using an electroless plating technique, forming a plating resist film by coating on the metallic seed film, patterning the plating resist film to form trenches in the plating resist film for exposing the metallic seed film, and depositing a metallic interconnect pattern on the metallic seed film in the trenches by an electrolytic plating technique using the metallic seed film as a cathode for the plating.

The semi additive technique further includes the steps of removing the plating resist film by a solvent, and etching an exposed portion of the metallic seed film not covered by the plating metallic film to thereby leave the metallic interconnect pattern.

The additive technique includes, in addition to the above mentioned steps, forming a permanent plating resist film on the metallic catalyst film by coating, patterning the permanent plating resist film to form trenches therein, and forming an interconnect pattern by an electroless plating technique within the trenches to form a Cu interconnect pattern.

FIGS. 1A to 1F show the conventional additive process. In FIG. 1A, a ZnO film 42 is formed on a substrate 41, followed by forming a Pb catalyst film 43 thereon, as shown in FIG. 1B. Subsequently, a permanent plating resist film is formed thereon by coating, followed by consecutive curing and development thereof to form a desired pattern on the permanent plating resist film 44, as shown in FIG. 1C, wherein a plurality of trenches 400 each for receiving an interconnect line are formed in the permanent plating resist film 44.

The resultant board 40 is then dipped in an accelerator 45 for activation of the Pb catalyst film 43, as shown in FIG. 1D. The board 40 is then dipped in a high-speed electrolytic additive plating liquid 46 for plating, as shown in FIG. 1E. Thus, a final board 50 is obtained wherein a plating Cu film pattern 47 overlies a ZnO film 42 formed on a substrate 41, as shown in FIG. 1F. Although a printed circuit board generally mounts thereon a plurality of Cu interconnect patterns, only the case of a single Cu interconnect pattern being mounted by the circuit board is described in this text for the purpose of simplification of the description.

Patent Publication JP-A-7-321111 describes another method using an electroless plating technique and reduction of ZnO for forming a Cu interconnect pattern. In the publication, a metallic film is first formed by dipping a board mounting thereon a ZnO film in an aqueous solution wherein a metal having a lower ionization tendency compared to ZnO is solved, followed by electrolytic plating or electroless plating the metallic film with another metal to form an interconnect pattern. In the dipping process, the ZnO film is replaced by the metallic film as a conductive film by reduction-depositing the metal in the aqueous solution on the board while solving the ZnO film in the aqueous solution by using the principle of the electroless plating.

Another conventional technique for forming a Cu interconnect pattern uses photo-catalytic property of ZnO wherein a resist film is not used for patterning of a conductive layer by using a ultraviolet exposure process while using a photo-mask. This technique uses the photo-catalytic property of ZnO known as a semiconductive oxide. The process includes the steps of dipping a substrate mounting thereon a 1-$\mu$m-thick ZnO film in an aqueous solution including palladium chloride (II) to allow the ZnO film to adsorb divalent palladium ions ($Pd^{2+}$), and exposing the resultant ZnO film to a ultraviolet ray by using a photo-mask to generate a photo-catalytic reaction in the ZnO film, whereby the palladium ions are reduced or deoxidized in the area of ultraviolet radiation to metallic palladium (Pd).

In the photo-catalytic reaction as described above, electrons in the valence band absorb ultraviolet ray to be excited and enter the conduction band. The excited electrons are then taken out from the surface of the ZnO film to cause the reduction reaction. In the described case, the excited electrons are consumed while reducing the palladium ions to metallic palladium.

The positive holes generated in the valence band by the photo-excitation are taken out from the surface of the ZnO film, similarly to the excited electrons, to cause oxidation reaction. In the described case, the positive holes are consumed while oxidizing the methanol and ethanol to aldehydic materials such as formaldehyde and acetaldehyde.

In an alternative process, the board is dipped in a pH-controlled mixture of aqueous solution of palladium chloride (II) and methanol or ethanol, and subjected to exposure to a ultraviolet ray by using a photo-mask to induce a photo-catalytic reaction of ZnO film, whereby the adsorption of palladium ions onto the surface of the ZnO film and selective reduction of palladium ions to metallic palladium are concurrently proceeded.

The board mounting thereon adsorbed palladium ions and metallic palladium is dipped in a pH-controlled aqueous solution of ethylenediamine (EDA), which has a function of forming chelate, to remove unnecessary palladium ions as EDA chelate. Thus, only the metallic palladium, which has a catalytic function for effecting electroless plating, is selectively left on the surface of the ZnO film.

The resultant board is then dipped in an electroless Cu plating liquid, whereby Cu is deposited on the metallic palladium, which functions as a catalytic core, to form an electroless-plating Cu film. Although the film thickness is small, the Cu interconnect pattern is formed without using a photoresist.

JP-A-9-260808 describes another technique wherein a board mounting thereon a specific film, which has a photocatalytic function and an increased photosensitivity due to an additive pigment, is dipped in a metallic-ion-containing aqueous solution including at least alcohol, while drawing a pattern on the board with laser having a wavelength corresponding to the absorption band of the pigment. The resultant board is then dipped in an aqueous solution having a function for forming chelate, to thereby remove absorbed metallic ions. Thus, a patterned metallic film having therein absorbed metallic atoms is obtained.

JP-A-10-043589 describes another technique wherein ZnO is used as a photo-catalyst while irradiating a ultraviolet ray to accelerate the reaction.

JP-A-10-245682 describes another technique wherein a board is dipped in an aqueous solution containing zinc nitrate and a reducing agent, while selectively irradiating the light having energy higher than the optical bandgap of ZnO to thereby form an interconnect pattern including ZnO on a board.

In the conventional techniques for forming an interconnect pattern on a ZnO film, the Cu interconnect layer is generally formed by electroless Cu plating using an aqueous solution having a function of forming a chelate, after a metallic catalyst is provided onto the ZnO film. That is, these techniques include the additional step for providing the metallic catalyst to the zinc oxide film, and thus increase the number of steps in the process.

In addition, in the additive technique as described above, it is liable that the metallic catalyst adsorbed on the ZnO film generally remains on the ZnO film in the final product and degrades the insulation between interconnects in the final product.

It is recited in JP-A-7-321111 that a reduction reaction of the oxide to metallic copper proceeds in the plating liquid during the electroless plating process using the reduction reaction of the ZnO film. However, the reduction reaction is not obtained unless an aqueous solution having a higher reduction function, such as an aqueous solution of hydrogenated boron sodium, is used.

In the techniques described in JP-A-9-260808, JP-A-10-043589 and JP-A-10-245682 wherein the photo-catalytic function of ZnO is used, a significant amount of light energy is absorbed in the solution in which irradiation is conducted and it is difficult for the irradiated light to reach the boundary of the reaction.

SUMMARY OF THE INVENTION

It is therefore an object of the present invention to provide a method for forming a Cu interconnect pattern having a higher insulation resistance and a higher density on a board.

The present invention provides, in a first aspect thereof, a method including the steps of forming a zinc oxide film overlying a substrate, forming a permanent plating resist film on the zinc oxide film, patterning the permanent plating resist film to form a trench therein for exposing the zinc oxide film, dipping the exposed zinc oxide film in an aqueous solution of copper sulfate to deposit a copper oxide film in the trench by replacing zinc in the exposed zinc oxide film by copper in the copper sulfate, dipping the copper oxide film in a reducing solution to reduce copper oxide in the copper oxide film to metallic copper-to form a metallic copper film in the trench, dipping the metallic copper film in a plating liquid to form a plating copper film on the metallic copper film in the trench.

The present invention provides, in a second aspect thereof, a method including the steps of forming a zinc oxide film overlying a substrate, dipping the zinc oxide film in an aqueous solution of copper sulfate to deposit a copper oxide film by replacing zinc in the zinc oxide film by copper in the copper sulfate, dipping the copper oxide film in a reducing solution to reduce copper oxide in the copper oxide film to metallic copper to form a metallic copper film, dipping the metallic copper film in a plating liquid to form a plating copper film on the metallic copper film, and patterning the metallic copper film and the plating copper film to form a copper interconnect pattern.

In accordance with the method of the present invention, the metallic copper film can be formed on the zinc oxide film by reducing the copper ions to metallic copper by using the reducing solution after the copper ions in the copper sulfate replace the zinc in the zinc oxide film. Thus, the metallic copper film can be plated by a plating copper film in a plating liquid to form a copper interconnect layer having a high insulation resistance and a high density without using plating catalyst, thereby reducing the number of steps in the process.

The above and other objects, features and advantages of the present invention will be more apparent from the following description, referring to the accompanying drawings.

PREFERRED EMBODIMENT OF THE INVENTION

Figure 1A:
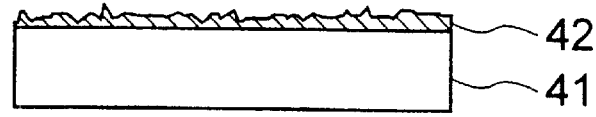
FIGS. 1A to 1F are sectional views of a board in consecutive steps of a conventional process for forming a Cu interconnect pattern on a ZnO film.
Figure 1B:
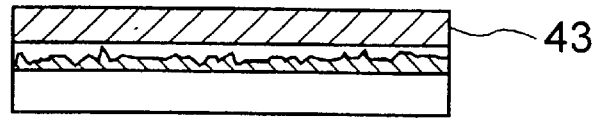
Figure 1C:
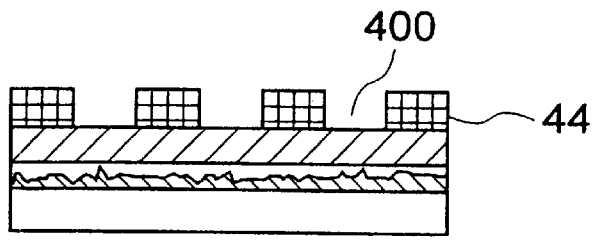
Figure 1D:
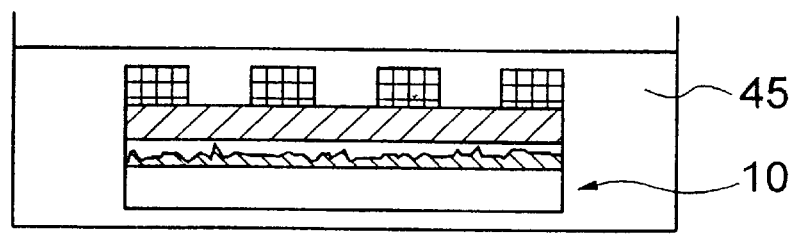
Figure 1E:
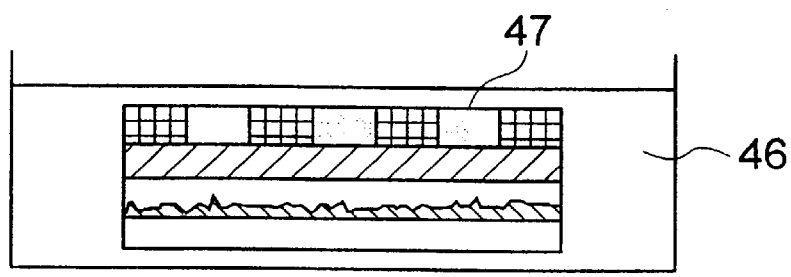

In a preferred embodiment of the present invention, the substrate is selected from the group including ceramic substrate, glass substrate, silicon wafer substrate and organic resin substrate.

The zinc oxide film may be one of a non-orientated film, a uniformly orientated film having a grain diameter equal to or less than 0.1 micrometer, and a specific film wherein a monovalent metal is implanted into zinc oxide. The monovalent metal is selected from the group of Li, Na and K.

During the dipping of the zinc oxide in the aqueous solution of copper sulfate, a part of the zinc oxide film may be replaced by a copper oxide film and another part of the zinc oxide film may be left as it is.

The reducing solution may be selected from the group including aqueous solutions of hydrogenated boron potassium, dimethylamineborane, and hydrogenated boron sodium.

The plating liquid may be an electroless plating liquid or an electrolytic plating liquid, and the electroless plating liquid may be preferably a high-speed electroless additive plating liquid.

If an additive process is used in the present invention, due to the absence of a metallic catalyst underlying the permanent plating resist film between interconnects, a higher density interconnect pattern with a higher insulation resistance can be obtained.

If a subtractive process is used in the present invention, due to the absence of metallic plating catalyst such as Pb, the zinc oxide between the interconnects can be removed with ease by using an acid used for etching, whereby a higher density interconnect pattern with a higher insulation resistance can be obtained.

On the other hand, as in the case of the conventional process, if an additive or subtractive process is used for forming the interconnect pattern on the board wherein the zinc oxide film overlying the substrate made of ceramic, glass, silicon wafer or organic resin, and if a metallic catalyst film such as including Pb, which is conventionally used for electroless plating of a zinc oxide film with copper, remains on the surface of the zinc oxide film, the insulation of the interconnect pattern may be degraded because the moisture or impurities attached onto the zinc oxide film are reacted with the residual metallic catalyst.

In the present invention, the board is dipped in an aqueous solution of copper sulfate, without using metallic catalyst, to form copper oxide by using the energy of oxygen in the zinc oxide film for forming oxide to replace zinc in the zinc oxide with copper, followed by reduction reaction of the copper oxide to the metallic copper film while using the reducing solution, such as an aqueous solution of hydrogenated boron potassium. Thus, the degradation of the interconnect pattern is suppressed.

In a practical example of the additive process, the interconnect pattern is formed by forming a permanent plating resist film by coating on the zinc oxide film without conducting a catalyst activation processing, and patterning the permanent plating resist film to form therein a plurality of trenches for receiving an interconnect pattern.

When the board is dipped in an aqueous solution of copper sulfate, since the surface of the zinc oxide film on which the interconnect pattern is to be formed is exposed in the trenches, the exposed zinc oxide is subjected to replacement of zinc by copper, wherein copper is selectively deposited in the trenches by using the energy of the oxygen in the zinc oxide, whereby a copper oxide film can be formed. After reducing the deposited copper oxide film to a metallic copper film, a plating process such as electroless plating, electrolytic plating or a combination of consecutive electroless plating and electrolytic plating is conducted to form a final interconnect pattern or layer.

Now, the present invention is more specifically described with reference to accompanying drawings, wherein similar constituent elements are designated by related reference numerals.

Figure 2A:
FIGS. 2A to 2F are sectional views of a board in consecutive steps of a process according to a first embodiment of the present invention.
Figure 2B:
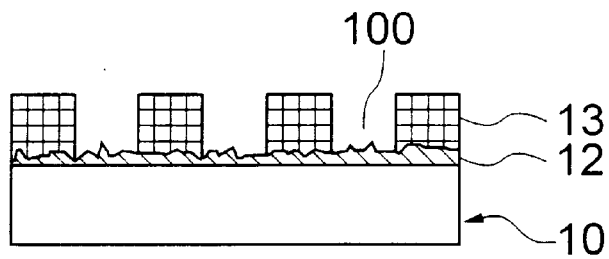
Figure 2C:
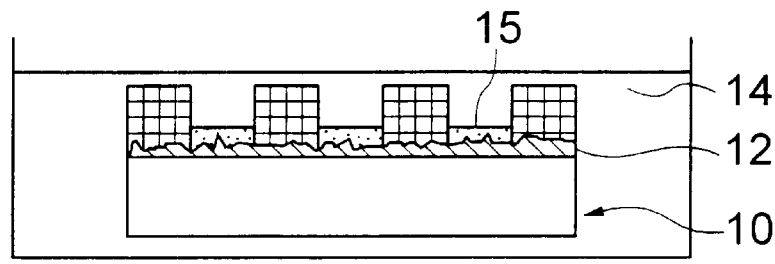
Figure 2D:
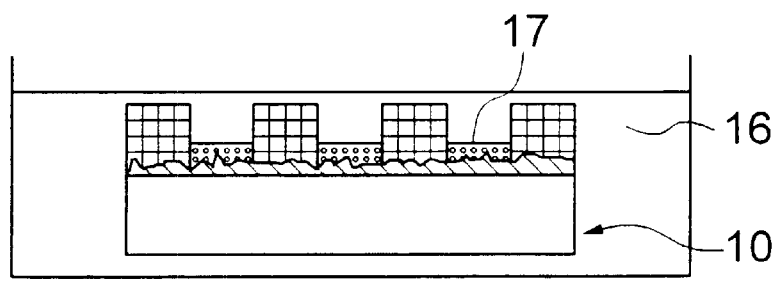
Figure 2E:
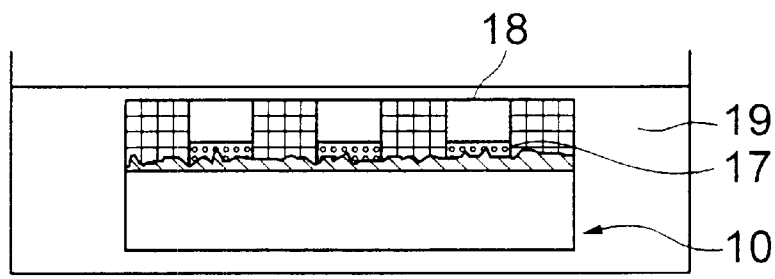
Figure 2F:
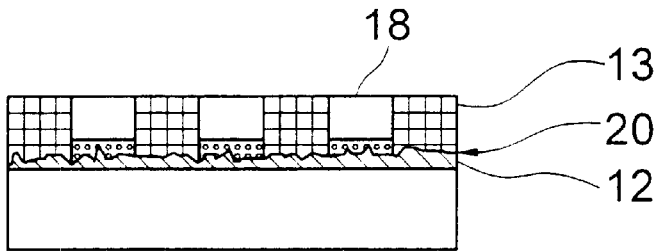

Referring to FIG. 2A to 2F, there is shown a process according to a first embodiment of the present invention. The process called herein "full additive process" roughly includes the steps of forming a zinc oxide film 12 on a substrate 11, as shown in FIG. 2A, forming a pattern on a permanent plating resist film 13 without providing metallic catalyst, as shown in FIG. 2B, dipping the resultant board 10 in an aqueous solution 14 of copper sulfate to replace zinc in the zinc oxide film 12 with copper, as shown in FIG. 2C, reducing the surface of the thus formed copper oxide film 15 by using an aqueous solution 16 of hydrogenated boron potassium to form a metallic copper film 17, as shown in FIG. 2D, and dipping the board 10 in a high-speed electroless additive plating liquid 19 to form a copper interconnect pattern 18, as shown in FIG. 2E, whereby a final circuit board 20 mounting thereon a high-density and high-reliability copper interconnect pattern 18 can be obtained, as shown in FIG. 2F.

More specifically, in FIG. 2A, the zinc oxide film 12 is formed on the substrate 11 by using a dry deposition technique such as CVD technique, magnetron sputtering technique and molecular beam epitaxial (MBE) technique, or a wet deposition technique such as sol-gel technique, spray-pyrolysis technique and soft solution electrochemical process (SSEP).

The substrate 11 may be selected from the group including ceramic substrate, glass substrate, silicon wafer substrate and organic resin substrate. The zinc oxide film 12 may be a non-oriented film, a uniformly oriented film having a grain diameter equal to or less than 0.1 micrometer, and a film wherein monovalent metal such as Li, Na and K is implanted in zinc oxide.

A photo-curable/alkali-developable permanent resist film 13 (such as made of PVI500TR2611 (trade mark) supplied from Taiyo Ink Co.) including cresol novolac epoxy resin is then formed by coating on the zinc oxide film 12 without providing a metallic catalyst thereto. Subsequently, the resist film 13 is subjected to exposure to a ultraviolet ray for curing by using a combination of mask film and mask glass or using a laser direct drawing technique to form a fine exposure pattern on the resist film 13, followed by development thereof. Thus, a fine pattern including a plurality of trenches 100 is formed on the resist film 13, as shown in FIG. 2B.

The resultant board 10 is then dipped in an aqueous solution 14 of 0.008 to 0.015 mol/l copper sulfate 14 at a temperature of 20 to 25° C. for one to five minutes. Thus, zinc in the zinc oxide film 12 is replaced by copper in the aqueous solution 14 of copper sulfate, whereby a copper oxide film 15 is formed on the zinc oxide film 12.

Figure 3:
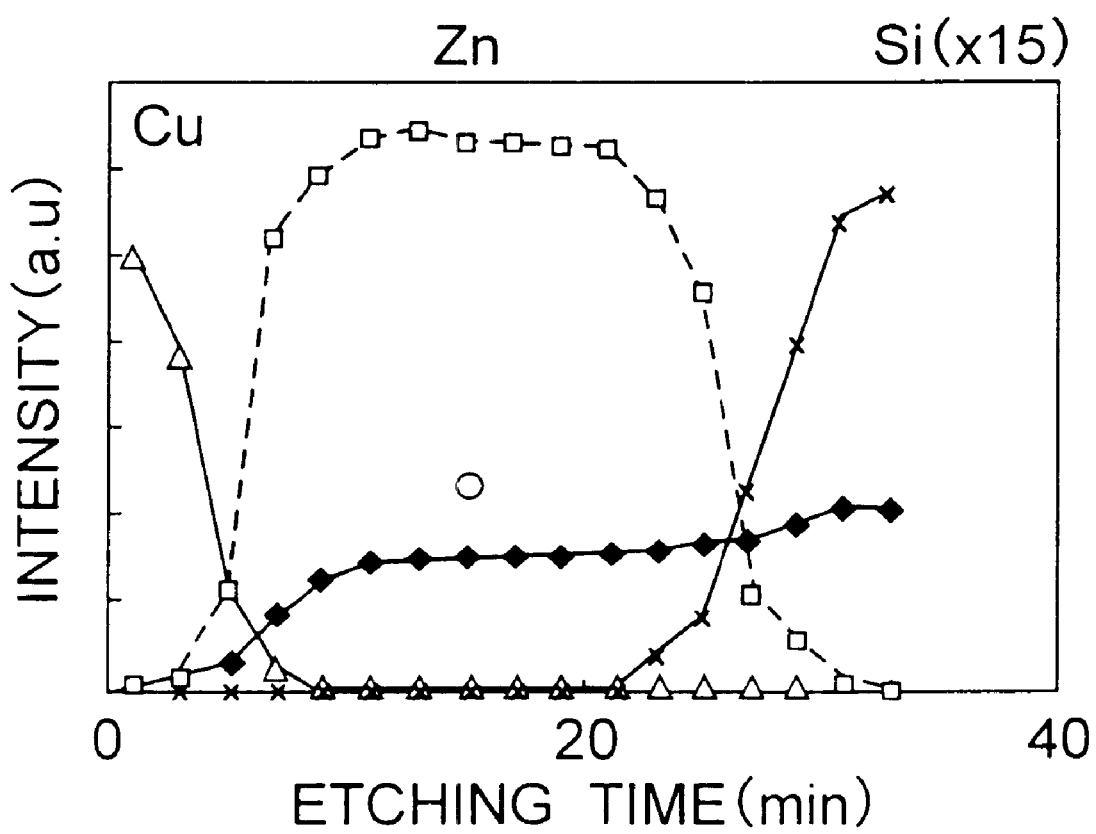
FIG. 3 is a graph showing the results of X-ray photoelectron spectroscopy.

FIG. 3 shows the results of X-ray photoelectron spectroscopy conducted after the deposition of copper oxide film in step 2C, wherein the intensity of spectroscopy in arbitrary unit is plotted on ordinate against the etching time (in minute) plotted on abscissa. The etching rate employed in the spectroscopy was 3.25 nm/min.

The results exhibited that after zinc in a 100-nm-thick zinc oxide film was replaced by copper in an aqueous solution of copper sulfate for a minute, the resultant film containing Cu/Zn at a ratio of 1:10 was 12 nm thick, with the deposited copper oxide overlying the original zinc oxide film. This reaction formula was considered as:

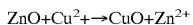

$$ZnO+Cu^{2+} \rightarrow CuO+Zn^{2+}$$

Subsequently, the resultant board 10 is dipped in an aqueous solution 16 of 0.007 to 0.015 mol/l hydrogenated boron potassium at a temperature of 20 to 25° C. as shown in FIG. 2D. Thus, the deposited CuO is reduced to metallic Cu by the hydrogenated boron potassium to form a metallic Cu film 17 in each trench 100.

The resistivity of the metallic Cu film 17 measured in the case of aqueous solution of 0.01 mol/l hydrogenated boron potassium at 20° C. was $10^{-5}$ Ω-cm. In the step of FIG. 2D, the aqueous solution 16 of hydrogenated boron potassium is dissolved into alkaline solution to have a potential of hydrogen (pH) of 10.0 to 13.5. By selecting a lower pH for the aqueous solution, a lower reduction rate can be obtained, which enables the thickness of the metallic Cu film 17 to be well controlled.

After the metallic Cu film 17 is formed on the board 10, the board 10 is dipped in a high-speed electroless additive plating liquid 19 having a function of forming chelate, whereby a plating Cu film 18 having a thickness equal to or less than 20 µm is formed on the metallic Cu film 17, as shown in FIG. 2E.

Examples of the chelate agent used in the high-speed electroless additive plating liquid 19 include polyamine such as ethylenediamine, diethylenetriamine, triethylenetetramine, tetraethylenepentamine and pentaethylenehexamine, Rochelle salt and cyan.

Thus, a final circuit board 20 having a high-density and high-reliability Cu interconnect pattern and a permanent plating resist film 13 on a zinc oxide film 12 can be obtained, as shown in FIG. 2G.

Figure 1F:
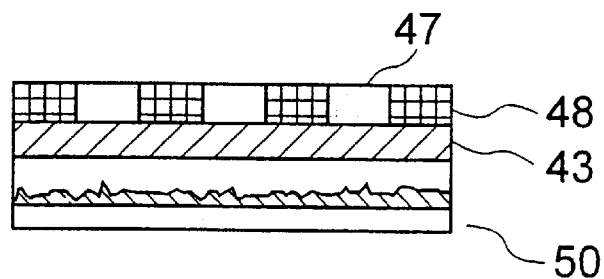

The printed circuit board 20 obtained by the embodiment has a higher reliability compared to the printed circuit board obtained by the conventional method due to the absence of a metallic catalyst film in the embodiment. The metallic catalyst film, such as the Pb catalyst film 43 in FIG. 1F, is liable to attachment by moisture or impurities onto the surface thereof and liable to reaction therewith to degrade the insulating function of the zinc oxide film.

Referring to FIGS. 4A to 4G, there is shown a subtractive process for forming a Cu interconnect pattern according to a second embodiment of the present invention.

Figure 4A:
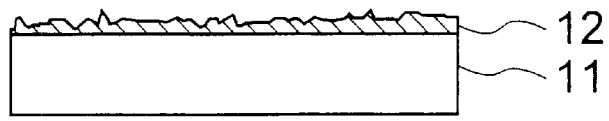
FIGS. 4A to 4G are sectional view of a board in consecutive steps of a process according to a second embodiment of the present invention.

In FIG. 4A, a zinc oxide film 12 is formed on a substrate 11 such as ceramic substrate, glass substrate, silicon wafer substrate or organic resin substrate. The zinc oxide film 12 may be one of a non-orientated film, a uniformly-oriented film having a grain diameter of 0.1 micrometer or less, and a film wherein a monovalent metal such as Li, Na and K is implanted.

Figure 4B:
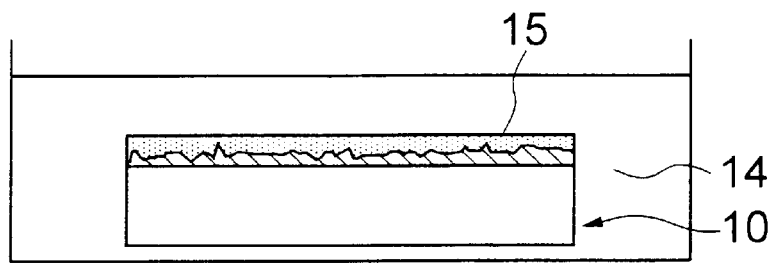

The resultant board 10 is dipped in an aqueous solution 14 of 0.008 to 0.015 mol/l copper sulfate at a temperature of 20 to 25° C. for one to five minutes, as shown in FIG. 4B, whereby a copper oxide film 15 is deposited on the zinc oxide film 12 by replacement.

Figure 4C:
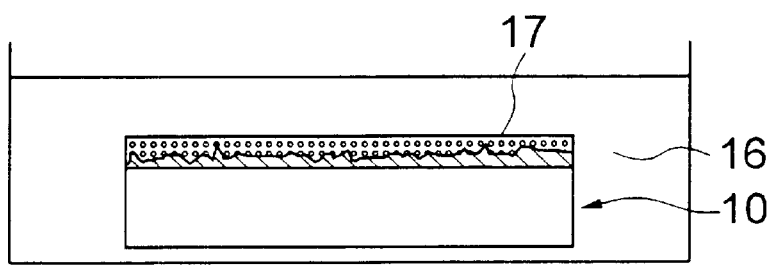

The surface of the copper oxide film 15 on the board 10 is then dipped in an aqueous solution 16 of 0.007 to 0.015 mol/l hydrogenated boron potassium at a temperature of 20 to 25° C. for reduction to form a metallic Cu film 17, as shown in FIG. 4C.

As an example, the metallic Cu film 17 formed by reduction by an aqueous solution of 0.01 mol/l hydrogenated boron potassium had a resistivity around $10^{-5}$ Ω-cm, and was capable of being directly plated thereon by electrolytic plating.

Figure 4D:
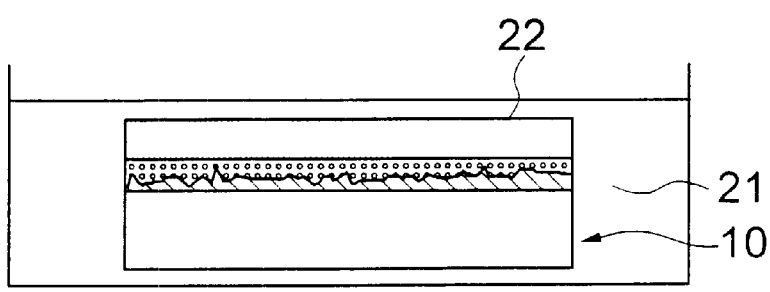

The resultant board 10 is then dipped in an electrolytic plating liquid 21 to plate the metallic-Cu film 17, as shown in FIG. 4D, to thereby form a plating Cu film 22 on the metallic Cu film 17.

The electrolytic plating process may be replaced by an electroless plating process or a combination of consecutive electroless plating process and electrolytic plating process.

Figure 4E:
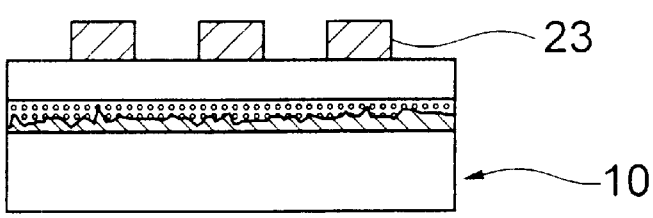
Figure 4F:
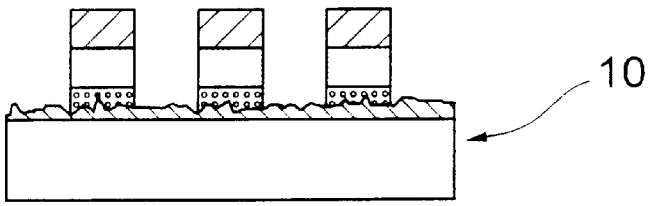
Figure 4G:
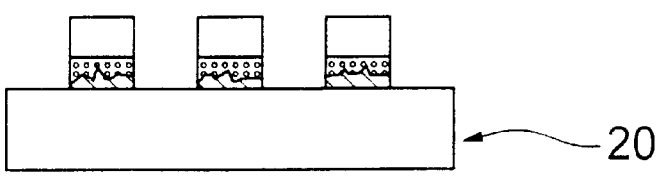

After the electrolytic plating, a temporary etching resist pattern 23 is formed on the plating Cu film 22 by using consecutive coating and photolithographic processes, as shown in FIG. 4E. Subsequently, the plating Cu film 22 and the deposited Cu film 17 are etched for patterning using the temporary etching resist pattern 23 as a mask, as shown in FIG. 4F.

Finally, the temporary etching resist pattern 23 is removed to obtain a printed circuit board 20 having a high-density and high-reliability Cu interconnect pattern, as shown in FIG. 2G.

In a modification of the first embodiment, a negative/chemical-amplification type permanent plating resist (such as KS series supplied from JSR corporation) may be used instead of the photo-curable/alkali developable permanent resist including cresol novolac epoxy resin. In the modification, the permanent plating resist is subjected to exposure to a ultraviolet ray using a combination of mask film and mask glass or using a laser direct drawing technique to form a desired pattern on the permanent plating resist. The resultant permanent plating resist is then subjected to post-exposure baking for curing thereof, followed by development for forming a desired pattern on the permanent plating resist 13.

In a further modification of the first embodiment, the aqueous solution 16 of hydrogenated boron potassium may be replaced by an aqueous solution of 0.07 to 0.15 mol/l dimethylamineborane (DMAB).

As an example, a metallic Cu film formed by reduction by an aqueous solution of 0.1 mol/l DMAB at 20° C. had a resistivity of $10^{-5}$ Ω-cm. The aqueous solution of DMAB has a lower reduction rate compared to the aqueous solution of hydrogenated boron potassium. Accordingly, by adding alkali to the aqueous solution of DMAB to control the potential of hydrogen between 10.0 and 12.5, the thickness of the metallic Cu film can be well controlled.

Since the above embodiments are described only for examples, the present invention is not limited to the above embodiments and various modifications or alterations can be easily made therefrom by those skilled in the art without departing from the scope of the present invention.

For example, the present invention is not limited to the method for forming a Cu interconnect pattern on a printed circuit board, and may be applicable to forming a Cu interconnect pattern on other devices such as semiconductor device, a LCD device or an optical device. The zinc oxide film may be formed directly on the substrate or may be formed on the substrate with an intervention of one or more of other layers such as insulator, conductor or semiconductor layers.

What is claimed is:

1. A method comprising the steps of forming a zinc oxide film overlying a substrate, the zinc oxide film being implanted with a monovalent metal selected from a group consisting of Li, Na, or K;

forming a permanent plating resist film on the zinc oxide film;

patterning the permanent plating resist film to form a trench therein for exposing the zinc oxide film;

dipping the exposed zinc oxide film in an aqueous solution of copper sulfate to deposit a copper oxide film in the trench by replacing zinc in the exposed zinc oxide film by copper in the copper sulfate;

dipping the copper oxide film in a reducing solution wherein the reducing solution includes at least one of hydrogenated boron potassium, dimethylamineborane, and hydrogenated boron sodium to reduce copper oxide in the copper oxide film to metallic copper to form a metallic copper film in the trench; and dipping the metallic copper film in a plating liquid to form a plating copper film on the metallic copper film in the trench.

2. The method as defined in claim 1, wherein the substrate is either ceramic substrate, glass substrate, silicon wafer substrate, or organic resin substrate.

3. The method as defined in claim 1, wherein a part of the zinc oxide film underlying the copper oxide film remains as the zinc oxide film after the step of dipping the exposed zinc oxide film.

4. The method as defined in claim 1, wherein the plating liquid is an electroless plating liquid.

5. The method as defined in claim 1, wherein a metallic catalyst is not provided onto the zinc oxide film.

6. A method comprising the steps of forming a zinc oxide film overlying a substrate, the zinc oxide film being selected from a group consisting of non-oriented zinc oxide film, uniformly oriented zinc oxide film having a grain diameter of 0.1 micrometer or less, and zinc oxide film implanted with a monovalent metal selected from a group consisting of Li, Na, or K;

dipping the zinc oxide film in an aqueous solution of copper sulfate to deposit a copper oxide film by replacing zinc in the zinc oxide film by copper in the copper sulfate;

dipping the copper oxide film in a reducing solution including at least one of hydrogenated boron potassium, dimethylamineborane, and hydrogenated boron sodium to reduce copper oxide in the copper oxide film to metallic copper to form a metallic copper film;

dipping the metallic copper film in a plating liquid to form a plating copper film on the metallic copper film; and patterning the metallic copper film and the plating copper film to form a copper interconnect pattern.

7. The method as defined in claim 6, wherein the substrate is either ceramic substrate, glass substrate, silicon wafer substrate, or organic resin substrate.

8. The method as defined in claim 6, wherein a part of the zinc oxide film underlying the copper oxide film remains as the zinc oxide film after the step of dipping the exposed zinc oxide film.

9. The method as defined in claim 6, wherein the plating liquid is an electrolytic plating liquid or an electroless plating liquid.

10. The method as defined in claim 6, wherein the step of dipping the metallic copper film includes consecutively dipping the metallic copper film in an electroless plating liquid and in an electrolytic plating liquid.

11. The method as defined in claim 6, wherein a metallic catalyst is not provided onto the zinc oxide.

\* \* \* \* \*